(12) United States Patent
Lu

(10) Patent No.: US 10,417,087 B2
(45) Date of Patent: Sep. 17, 2019

(54) SYSTEM AND METHOD FOR ADAPTIVE MULTIPLE READ OF NAND FLASH

(71) Applicant: NGD Systems, Inc., Irvine, CA (US)

(72) Inventor: Guangming Lu, Irvine, CA (US)

(73) Assignee: NGD Systems, Inc., Irvine, CA (US)

( * ) Notice: Subject to any disclaimer, the term of this patent is extended or adjusted under 35 U.S.C. 154(b) by 0 days.

(21) Appl. No.: 15/723,041

(22) Filed: Oct. 2, 2017

(65) Prior Publication Data

US 2018/0024881 A1    Jan. 25, 2018

Related U.S. Application Data

(63) Continuation-in-part of application No. 15/230,075, filed on Aug. 5, 2016, now Pat. No. 10,216,572, (Continued)

(51) Int. Cl.
*H03M 13/37* (2006.01)
*G06F 11/10* (2006.01)
(Continued)

(52) U.S. Cl.
CPC ...... *G06F 11/1068* (2013.01); *G06F 11/1012* (2013.01); *G11C 11/5642* (2013.01); *G11C 16/26* (2013.01); *G11C 16/28* (2013.01); *G11C 29/021* (2013.01); *G11C 29/028* (2013.01); *G11C 29/52* (2013.01); (Continued)

(58) Field of Classification Search
CPC .. G06F 11/076; G06F 11/1008; G06F 11/106; G06F 11/1068; G06F 11/1012; H05K 999/99; G11C 2029/0411; G11C 16/26; G11C 11/5642; G11C 29/021; G11C 29/028; G11C 29/52; G11C 16/28; G11C 29/42; H03M 13/3707; H03M 13/1108; H03M 13/6325; H03M 13/3769;
(Continued)

(56) References Cited

U.S. PATENT DOCUMENTS 8,250,437 B2 * 8/2012 Sakurada ............ G11C 11/5642
714/764
8,707,132 B2    4/2014 Nakagawa et al.
(Continued)

FOREIGN PATENT DOCUMENTS

WO    WO 2009002940 A2 * 12/2008 .......... G06F 11/1072

*Primary Examiner* — Samir W Rizk
*Assistant Examiner* — Enam Ahmed
(74) *Attorney, Agent, or Firm* — Lewis Roca Rothgerber Christie LLP

(57) ABSTRACT

A system and method for adaptive multiple read of NAND flash memory. A solid state drive may employ adaptive multiple-read to perform enhanced performance error correction using soft decisions without a performance penalty that otherwise might result from performing unnecessary reads. The soft decision error correcting algorithm may employ lookup tables containing log likelihood ratios. The method may include performing one or more read operations to obtain one or more raw data words for a code word, attempting to decode the code words using the one or more raw data words, and performing additional read operations when the decoding attempt fails. This process may be repeated until a decoding attempt succeeds.

18 Claims, 7 Drawing Sheets

Related U.S. Application Data which is a continuation-in-part of application No. 14/806,063, filed on Jul. 22, 2015, now abandoned.

(60) Provisional application No. 62/403,610, filed on Oct. 3, 2016, provisional application No. 62/027,683, filed on Jul. 22, 2014.

(51) Int. Cl.

| | | |
|---|---|---|
| *G11C 16/28* | (2006.01) | |
| *G11C 29/52* | (2006.01) | |
| *G11C 11/56* | (2006.01) | |
| *G11C 16/26* | (2006.01) | |
| *G11C 29/02* | (2006.01) | |
| *H03M 13/11* | (2006.01) | |
| *H03M 13/29* | (2006.01) | |
| *H03M 13/00* | (2006.01) | |
| *G11C 29/42* | (2006.01) | |
| *H03M 13/09* | (2006.01) | |
| *G11C 29/04* | (2006.01) | |

(52) U.S. Cl.
CPC ... *H03M 13/1108* (2013.01); *H03M 13/2906* (2013.01); *H03M 13/2951* (2013.01); *H03M 13/3707* (2013.01); *H03M 13/3723* (2013.01); *H03M 13/3769* (2013.01); *H03M 13/6325* (2013.01); *G11C 29/42* (2013.01); *G11C 2029/0411* (2013.01); *H03M 13/09* (2013.01); *H03M 13/1111* (2013.01)

(58) Field of Classification Search
CPC ......... H03M 13/3723; H03M 13/2906; H03M 13/2951; H03M 13/09; H03M 13/1111
USPC ....................................................... 714/764
See application file for complete search history.

(56) References Cited

U.S. PATENT DOCUMENTS

| | | | |
|---|---|---|---|
| 8,875,003 B1* | 10/2014 | Wolter | H03M 13/2906 |
| | | | 714/784 |
| 8,924,824 B1 | 12/2014 | Lu | |
| 9,244,763 B1* | 1/2016 | Kankani | G06F 11/1008 |
| 9,633,740 B1* | 4/2017 | Alhussien | G11C 16/28 |
| 9,697,077 B2* | 7/2017 | Sokolov | G06F 11/1072 |
| 9,870,830 B1* | 1/2018 | Jeon | G11C 16/3459 |
| 2008/0109703 A1* | 5/2008 | Brandman | G06F 11/1068 |
| | | | 714/763 |
| 2008/0263265 A1* | 10/2008 | Litsyn | G11C 11/5628 |
| | | | 711/103 |
| 2011/0066902 A1* | 3/2011 | Sharon | G11C 16/349 |
| | | | 714/721 |
| 2014/0040704 A1* | 2/2014 | Wu | G06F 11/1068 |
| | | | 714/773 |
| 2014/0149825 A1* | 5/2014 | Motwani | H03M 13/3723 |
| | | | 714/764 |
| 2015/0127883 A1* | 5/2015 | Chen | G11C 11/5642 |
| | | | 711/103 |
| 2015/0193302 A1* | 7/2015 | Hyun | G11C 29/52 |
| | | | 714/764 |
| 2015/0309872 A1* | 10/2015 | Cai | G06F 11/1024 |
| | | | 714/764 |
| 2015/0339189 A1* | 11/2015 | Wu | G06F 11/1076 |
| | | | 714/764 |
| 2016/0006462 A1* | 1/2016 | Hanham | H03M 13/3723 |
| | | | 714/764 |
| 2016/0274969 A1 | 9/2016 | Chen et al. | |
| 2016/0306694 A1 | 10/2016 | Tai et al. | |

\* cited by examiner

SYSTEM AND METHOD FOR ADAPTIVE MULTIPLE READ OF NAND FLASH

CROSS-REFERENCE TO RELATED APPLICATION(S)

The present application claims priority to and the benefit of U.S. Provisional Application No. 62/403,610, filed Oct. 3, 2016, entitled "METHOD OF ADAPTIVE MULTIPLE-READ FOR NAND FLASH", and is a continuation-in-part of U.S. patent application Ser. No. 15/230,075, filed on Aug. 5, 2016, entitled "FLASH CHANNEL CALIBRATION WITH MULTIPLE LOOKUP TABLES", ("the '075 Application"), which is a continuation-in-part of U.S. patent application Ser. No. 14/806,063, filed Jul. 22, 2015, entitled "METHOD OF FLASH CHANNEL CALIBRATION WITH MULTIPLE LUTS FOR ADAPTIVE MULTIPLE-READ", which claims priority to and the benefit of U.S. Provisional Application No. 62/027,683, filed Jul. 22, 2014, entitled "METHOD OF FLASH CHANNEL CALIBRATION WITH MULTIPLE LUTS FOR ADAPTIVE MULTIPLE-READ"; the entire contents of all of the above-identified documents are hereby incorporated herein by reference.

FIELD

One or more aspects of embodiments according to the present invention relate to flash memory, and more particularly to a system and method for adaptive multiple read of NAND flash memory.

BACKGROUND

As the feature size of lithographic geometry for NAND flash chips is decreased, the number of electrons that can be used in storage may also be reduced, and assuring accurate information storage may become more challenging. Moreover, reductions in feature size may increase the risk of inter-cell interference. High-capacity NAND flash memory may achieve high density storage by using multi-level cells (two bits/cell for multi-level cell (MLC) or three bits/cell for triple level cell (TLC)) to store more than one bit per cell. Four levels or eight levels or more may be used. A large number of levels (and small voltage differences between levels) may result in a relatively low signal-to-noise ratio of the read channel, and a relatively high raw bit error rate (RBER). Error-correction code (ECC) (e.g., a low density parity check (LDPC) code) may be used to mitigate read errors.

The use of an LDPC code may involve reading the flash memory multiple times, which may degrade the performance of the flash memory. Thus, there is a need for a system and method for reading a flash memory multiple times, while providing good performance.

SUMMARY

Aspects of embodiments of the present disclosure are directed toward a system and method for adaptive multiple read of NAND flash memory. A solid state drive may employ adaptive multiple-read to perform enhanced performance error correction using soft decisions without a performance penalty that otherwise might result from performing unnecessary reads. The soft decision error correcting algorithm may employ lookup tables containing log likelihood ratios. The method may include performing one or more read operations to obtain one or more raw data words for a code word, attempting to decode the code words using the one or more raw data words, and performing additional read operations when the decoding attempt fails. This process may be repeated until a decoding attempt succeeds.

According to an embodiment of the present invention there is provided a method for reading data, the method including: performing a first read operation on a first plurality of flash memory cells, at a first reference voltage, to form a first raw data word; executing a first error correction code decoding attempt with the first raw data word; when the first error correction code decoding attempt succeeds: outputting a decoded data word generated by the first error correction code decoding attempt; and when the first error correction code decoding attempt does not succeed: performing a second read operation on the first plurality of flash memory cells, at a second reference voltage, to form a second raw data word; and executing a second error correction code decoding attempt with the first raw data word and the second raw data word.

In one embodiment, the performing of the first read operation includes storing the first raw data word in a buffer, the buffer having sufficient capacity to store the first raw data word and the second raw data word.

In one embodiment, the performing of the second error correction code decoding attempt includes fetching, from a first lookup table, a log likelihood ratio corresponding to: a bit of the first raw data word; and a corresponding bit of the second raw data word.

In one embodiment, the method includes, when the second error correction code decoding attempt succeeds: outputting a decoded data word generated by the second error correction code decoding attempt; and when the second error correction code decoding attempt does not succeed: performing a third read operation on the first plurality of flash memory cells, at a third reference voltage, to form a third raw data word; and executing a third error correction code decoding attempt with the first raw data word, the second raw data word, and the third raw data word.

In one embodiment, the performing of the third error correction code decoding attempt includes fetching, from a second lookup table, a log likelihood ratio corresponding to: a bit of the first raw data word; a corresponding bit of the second raw data word; and a corresponding bit of the third raw data word.

In one embodiment, the method includes: performing a third read operation on a second plurality of flash memory cells, at the first reference voltage, to form a third raw data word, the second plurality of flash memory cells being in one page of flash memory with the first plurality of flash memory cells; and when the first error correction code decoding attempt does not succeed: performing a fourth read operation on the second plurality of flash memory cells, at the second reference voltage, to form a fourth raw data word.

In one embodiment, the method includes: when the second error correction code decoding attempt succeeds: performing a third error correction code decoding attempt with the third raw data word and the fourth raw data word.

In one embodiment, the method includes: when the third error correction code decoding attempt succeeds: outputting a decoded data word generated by the third error correction code decoding attempt; and when the third error correction code decoding attempt does not succeed: performing a fifth read operation on the second plurality of flash memory cells, at a third reference voltage, to form a fifth raw data word; and executing a fourth error correction code decoding attempt with the third raw data word, the fourth raw data word, and the fifth raw data word.

According to an embodiment of the present invention there is provided a solid state drive, including: flash memory; and a processing circuit, the processing circuit being configured to: perform a first read operation on a first plurality of flash memory cells, at a first reference voltage, to form a first raw data word; execute a first error correction code decoding attempt with the first raw data word; when the first error correction code decoding attempt succeeds: output a decoded data word generated by the first error correction code decoding attempt; and when the first error correction code decoding attempt does not succeed: perform a second read operation on the first plurality of flash memory cells, at a second reference voltage, to form a second raw data word; and execute a second error correction code decoding attempt with the first raw data word and the second raw data word.

In one embodiment, the performing of the first read operation includes storing the first raw data word in a buffer, the buffer having sufficient capacity to store the first raw data word and the second raw data word.

In one embodiment, the performing of the second error correction code decoding attempt includes fetching, from a first lookup table, a log likelihood ratio corresponding to: a bit of the first raw data word; and a corresponding bit of the second raw data word.

In one embodiment, the processing circuit is further configured to: when the second error correction code decoding attempt succeeds: output a decoded data word generated by the second error correction code decoding attempt; and when the second error correction code decoding attempt does not succeed: perform a third read operation on the first plurality of flash memory cells, at a third reference voltage, to form a third raw data word; and execute a third error correction code decoding attempt with the first raw data word, the second raw data word, and the third raw data word.

In one embodiment, the performing of the third error correction code decoding attempt includes fetching, from a second lookup table, a log likelihood ratio corresponding to: a bit of the first raw data word; a corresponding bit of the second raw data word; and a corresponding bit of the third raw data word.

In one embodiment, the processing circuit is further configured to: perform a third read operation on a second plurality of flash memory cells, at the first reference voltage, to form a third raw data word, the second plurality of flash memory cells being in one page of flash memory with the first plurality of flash memory cells; and when the first error correction code decoding attempt does not succeed: perform a fourth read operation on the second plurality of flash memory cells, at the second reference voltage, to form a fourth raw data word.

In one embodiment, the processing circuit is further configured to: when the second error correction code decoding attempt succeeds: perform a third error correction code decoding attempt with the third raw data word and the fourth raw data word.

In one embodiment, the processing circuit is further configured to: when the third error correction code decoding attempt succeeds: output a decoded data word generated by the third error correction code decoding attempt; and when the third error correction code decoding attempt does not succeed: perform a fifth read operation on the second plurality of flash memory cells, at a third reference voltage, to form a fifth raw data word; and execute a fourth error correction code decoding attempt with the third raw data word, the fourth raw data word, and the fifth raw data word.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a system and method for adaptive multiple read of NAND flash provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1A:
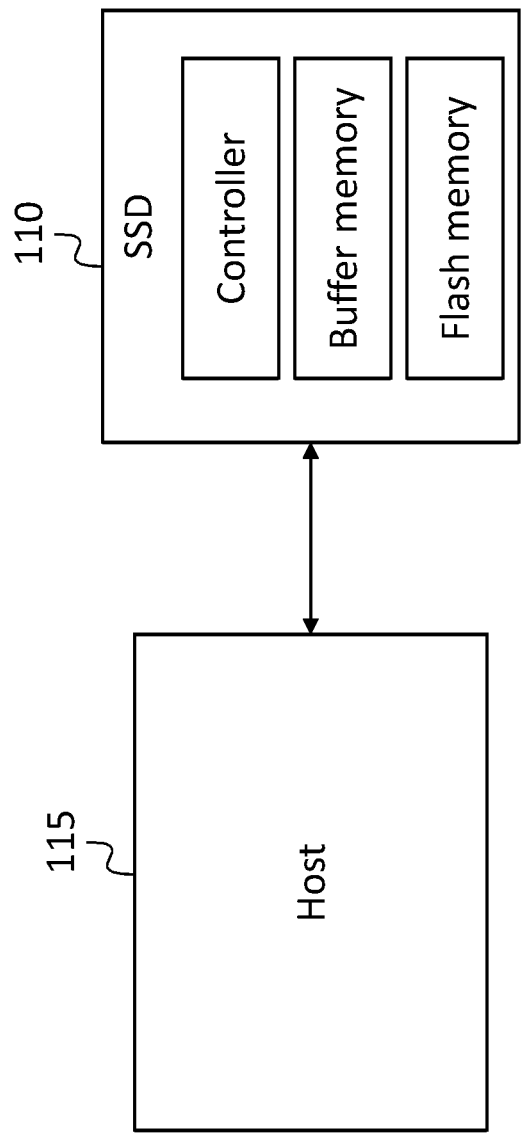
FIG. 1A is a block diagram of a host computer and a solid state drive, according to an embodiment of the present invention.

Referring to FIG. 1A, in some embodiments a solid state drive 110 may, in operation, be connected to, and provide storage for, a host 115, e.g., a server or other computer. The host interface (including the host connector, and the communications protocols) between the solid state drive 110 and the host may be, for example, a storage interface such as Serial Advanced Technology Attachment (SATA), Fibre Channel, Small Computer System Interface (SCSI), Serial Attached SCSI (SAS), Peripheral Component Interconnect Express (PCIe), Non Volatile Memory Express (NVMe), SCSI over PCIe, or a more general-purpose interface such as Ethernet or Universal Serial Bus (USB). In some embodiments, the solid state drive 110 may conform to a 3.5 inch hard drive form-factor (or "large form factor" (LFF)) standard, or it may conform to a 2.5 inch hard drive form-factor (or small form factor (SFF)) standard. In other embodiments the solid state drive 110 may conform to a standard PCIe card form factor, e.g., a full-height, full length (FH-FL) card outline, or a full-height, half length (FH-HL) outline. The solid state drive 110 may include a controller, buffer memory, and flash memory. The controller may execute software and/or firmware, stored, for example, in the buffer memory, or in read-only memory in the controller (or separate from the controller).

The flash memory may include a plurality of cells, each including a transistor with a floating gate. The cell may be programmed by a process that stores charge on the floating gate. The transistor includes an additional control gate, or "word line control gate" on top of the floating gate. When a voltage is applied to the word line control gate, the state of the transistor (whether on (e.g., conducting) or off (e.g., not conducting) depends both on the amount of charge stored on the floating gate, and on the voltage (or "word line voltage", or "reference voltage") applied to the word line control gate. Accordingly, the threshold voltage (i.e., the reference voltage at which the transistor transitions between the on state and the off state) depends on the amount of charge stored on the floating gate. The amount of charge stored on the floating gate may be used to store information. For example, in a single level cell (SLC), a large negative charge may represent 0 (or "0" or "logical 0") and a smaller negative charge or no negative charge may represent 1 (or "1" or "logical 1"). In a multi-level cell (MLC), four different states, each corresponding to a different amount of charge stored on the floating gate may be used to store two bits, and in a Triple Level Cell (TLC)) eight different states may be used to store three bits.

The flash memory cell may be read by applying the reference voltage to the word line control gate and determining, using a sense amplifier comparator, whether the transistor is on or off. The reference voltage may be adjustable in increments of a reference voltage step size (e.g., 1 mV), which may be a characteristic of a readout circuit in (and fabricated with) the flash memory device. After the cell is programmed, the amount of charge stored on the floating gate may change gradually, resulting, on occasion, in a difference between a logical value (or "bit value") that was written to the cell and a bit value that is read from the cell. Such a difference may be referred to as a "bit flip". Whether a bit is flipped in a cell may depend on the reference voltage used to read the cell; in general, a bit may flip if the change in the amount of charge stored on the floating gate causes the threshold voltage to move from one side of the reference voltage to the other side of the reference voltage (e.g., causes the threshold voltage to change from being less than the reference voltage to being greater than the reference voltage). Error correcting codes may be used to correct errors resulting from bit flips. Such error correcting codes may use, as input, a quantity of data (i.e., a number of bits) referred to herein as a "code word".

In some embodiments, a plurality of flash memory cells may be read multiple times with multiple different values of the reference voltage (i.e., the voltage applied to the word line of the flash memory cells). Each reference voltage may be selected from a set of available reference voltages (e.g., voltages generated by a set of voltage sources, or by an analog to digital converter). After each read operation, the results, i.e., the raw data, may be fed to an error correcting code block which may attempt to decode the raw data (i.e., to correct any errors in the raw data). If the decoding attempt succeeds, the decoded data may, e.g., be delivered to the host. If the decoding attempt fails, an additional read operation may be performed, with another value of the reference voltage. This process, in which additional read operations are performed until error decoding succeeds, may be referred to as "adaptive multi-read". In this manner, the spending of time performing a third read operation may be avoided, for example, when after a second read operation, sufficient information has been obtained to perform a successful decoding operation.

Figure 1B:
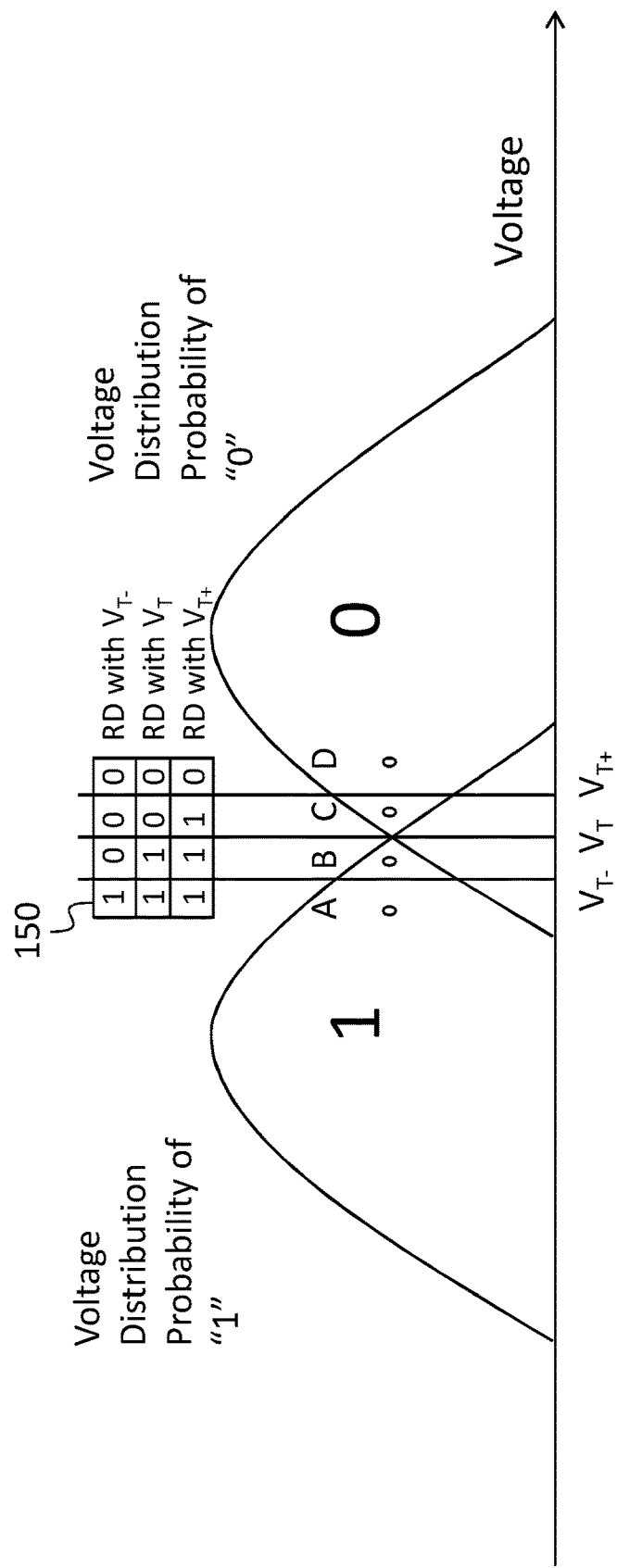
FIG. 1B is a graph of probability density functions, according to an embodiment of the present invention.

Each decoding attempt may employ a lookup table (LUT) including an entry for each possible outcome for the set of read operations performed. During each read operation, the corresponding voltage may be applied to the word line, and a sense amplifier comparator may generate an output corresponding to, e.g., logical 1 if the flash cell transistor turns on at the current reference voltage, and logical 0 if it does not. Accordingly, the threshold voltage of the flash cell may be inferred to fall into one of a plurality of regions each bounded by one or two reference voltages. For example, in FIG. 1B, if read operations are performed with each of three available reference voltage values of $V_{T-}$, $V_T$, and $V_{T+}$, then, given the results of the read operations, the threshold voltage may be inferred to be in one of four regions, labelled A, B, C, and D in FIG. 1B, and corresponding respectively to threshold voltage values that are (i) less than $V_{T-}$, (ii) greater than $V_{T-}$ and less than $V_T$, (iii) greater than $V_T$ and less than and $V_{T+}$, and (iv) greater than $V_{T+}$. The read result table 150 of FIG. 1B shows the result of each of the read operations for each of these four cases. For example, if the threshold voltage is in region B, then the three read operations (with reference voltages of $V_{T-}$, $V_T$, and $V_{T+}$) may generate raw data of {0 1 1}, as shown in the second column of the read result table 150. As used herein, a list of binary digits between brace brackets (e.g., {0 1 1}) represents a sequence of raw bits obtained from multiple read operations performed at respective reference voltages of a corresponding sequence of reference voltages.

The input to an error correcting decoder using soft decision values may include a log likelihood ratio (LLR) for each cell. The log likelihood ratio may be defined as log(P(0)/P(1)) (where "log", without a subscript, refers to the natural logarithm) where P(0) is the probability of "0" being the bit that was written to the cell and P(1) is the probability of "1" being the bit that was written to the cell. This log likelihood ratio may be obtained from a lookup table that has one entry for each of the regions, e.g., four entries, corresponding to the regions A, B, C, and D of FIG. 1B. If adaptive multi-read is employed, several lookup tables may be present, one for each user-defined combination of read operations (e.g., one for each user-defined read sequence). For example, a first read operation may be performed with a reference voltage of $V_T$, resulting in a 1 if the threshold voltage is in region A or B and a 0 if the threshold voltage is in region C or D. A first lookup table, corresponding to this first read operation, may then have two entries, one being the log likelihood ratio for a threshold voltage less than $V_T$ (corresponding to regions A and B) and the other being the log likelihood ratio for a threshold voltage greater than $V_T$ (corresponding to regions C and D).

A second lookup table may contain log likelihood ratios for, for example, the three possible results after a first read operation with a threshold voltage of $V_T$, and a second read operation with a threshold voltage of $V_{T-}$. A third lookup table may contain log likelihood ratios for the four possible results after a first read operation with a threshold voltage of $V_T$, a second read operation with a threshold voltage of $V_{T-}$, and a third read operation with a threshold voltage of $V_{T+}$. Although FIG. 1B illustrates an exemplary embodiment utilizing three different reference voltages; other embodiments may use fewer or more different reference voltages (e.g., five different reference voltages).

Performing a larger number of read operations on each cell may result in an increased likelihood of successful decoding, but it may also result in a reduction in performance, e.g., an increase in the time taken to complete the execution of a read command. For example, each read operation may take about 50 microseconds (50 us) for a 2-bit/cell MLC, and more than 100 us for a 3-bit/cell TLC. Moreover, read operations at different reference voltages within one page of flash memory may be constrained to be performed at only one reference voltage at a time. As such, considerable performance improvements may be achieved by avoiding read operations that are not necessary for successful decoding (e.g., by omitting a third read operation when after two read operations successful decoding is already possible).

Figure 2:
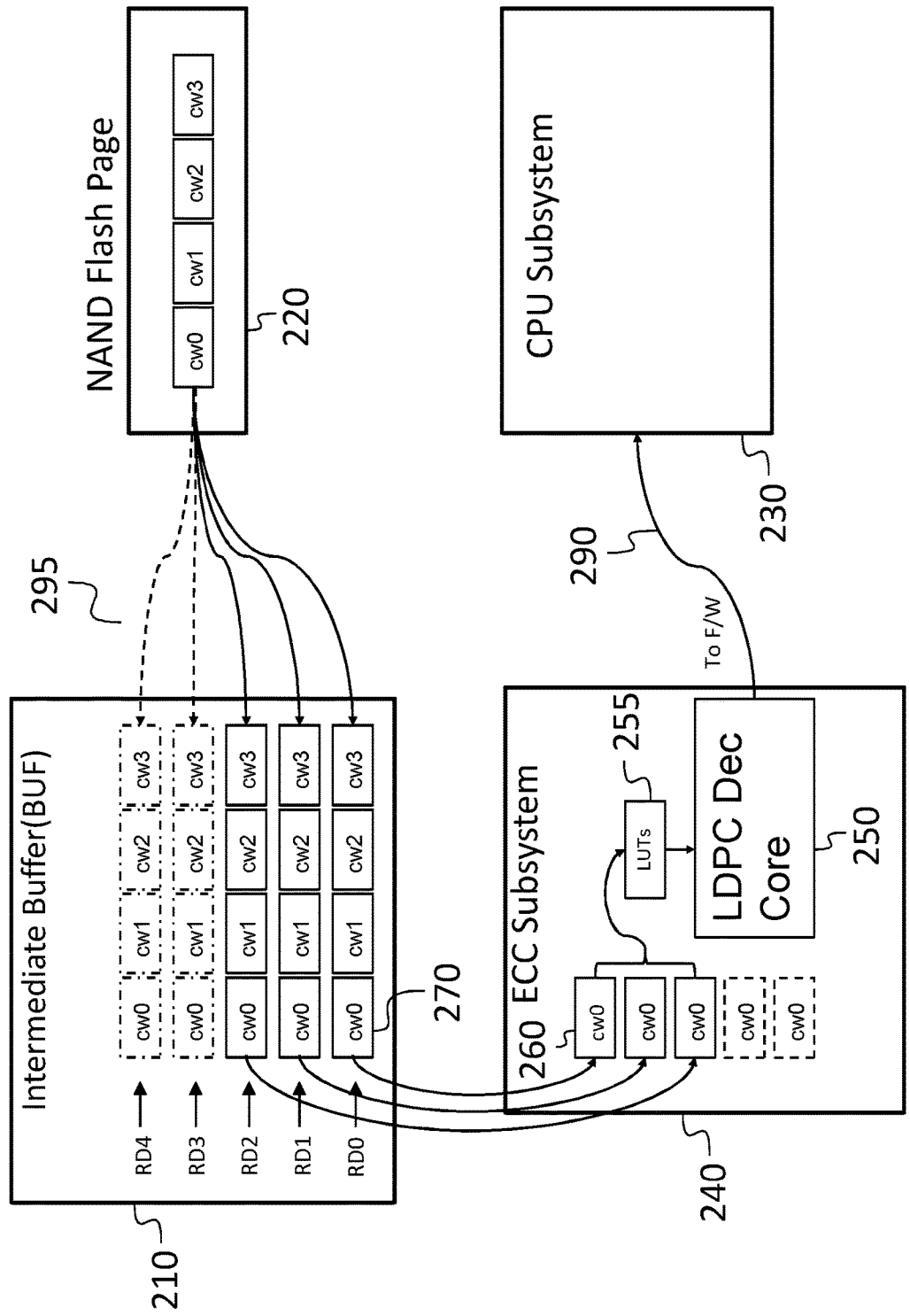
FIG. 2 is a block diagram of a system for performing adaptive multiple reads, according to an embodiment of the present invention.

FIG. 2 is a block diagram of an adaptive multiple-read system for NAND flash, in some embodiments. The adaptive multiple-read system includes an intermediate buffer 210, a NAND flash memory array 220, a central processing unit (CPU) subsystem 230 and an error correcting code (ECC) subsystem 240. The central processing unit (CPU) subsystem 230 and the error correcting code (ECC) subsystem 240 may be part of the solid state drive controller. The ECC subsystem 240 includes a plurality of lookup tables 255, for looking up soft decision values, e.g., log likelihood ratios, as mentioned above. For example, the lookup table for a three-read case (as illustrated in FIG. 1B) may translate the pattern {1 1 1} to the soft-decision value S30, it may translate the pattern {0 1 1} to the soft-decision value S31, it may translate the pattern {0 0 1} to the soft-decision value S32, and it may translate the pattern {0 0 0} to the soft-decision value S33. For a two-read case the lookup table may translate the pattern {1 1} to the soft-decision value S20, it may translate the pattern {0 1} to the soft-decision value S21, and it may translate the pattern {0 0} to the soft-decision value S22.

For a four-read case, the lookup table may translate the pattern {1 1 1 1} to the soft-decision value S40, it may translate the pattern {0 1 1 1} to the soft-decision value S41, it may translate the pattern {0 0 1 1} to the soft-decision value S42, it may translate the pattern {0 0 0 1} to the soft-decision value S43, and it may translate the pattern {0 0 0 0} to the soft-decision value S44. The lookup tables may be programmed with data from a NAND flash channel calibration phase (as described, for example, in the '075 application) or from a firmware and/or software calculation using a pre-defined flash channel model. Each soft-decision value may be a log likelihood ratio, as mentioned above.

The execution of a read command may then be adaptive. For example, after one or more read operations have been performed, a decoding attempt may be made, and, if the decoding attempt fails, additional read operations may be performed and another decoding attempt may be made.

For example, in some embodiments, a first read operation, which may be referred to as RD0, may be performed (through the flash channel interface 295) at a first reference voltage, and a raw data word corresponding to code word 0 (cw0 in FIG. 2) may be stored in a corresponding code word buffer 270 of the intermediate buffer 210. This code word may then be transferred from the intermediate buffer 210 to a local code word buffer 260 in the ECC subsystem 240. An LDPC decoder 250 may then attempt to decode the code word, using the lookup table for the one-read case, from among the set of lookup tables 255. If the decoding attempt succeeds, the system may output (or store for future output) the decoded code word. If the decoding attempt fails, the ECC subsystem 240 notifies the firmware via an internal communication system 290. The firmware executing in the CPU subsystem 230 then executes a second read operation (RD1), at a different reference voltage, the raw data word from which is saved in another code word buffer of the intermediate buffer 210 (and copied into another local code word buffer in the ECC subsystem 240). The LDPC decoder 250 then attempts again to decode the code word, this time using the respective raw data words from the first and second read operations, and the lookup table for the two-read case. If the decoding attempt succeeds, the system may output (or store for future output) the decoded code word. If the decoding attempt fails, additional read operations and decoding attempts may be made until a decoding attempt succeeds, or until failure is declared (at which point a RAID recovery may be used (where the RAID is a redundant array of independent disks of which the solid state drive 110 is a member).

Figure 3:
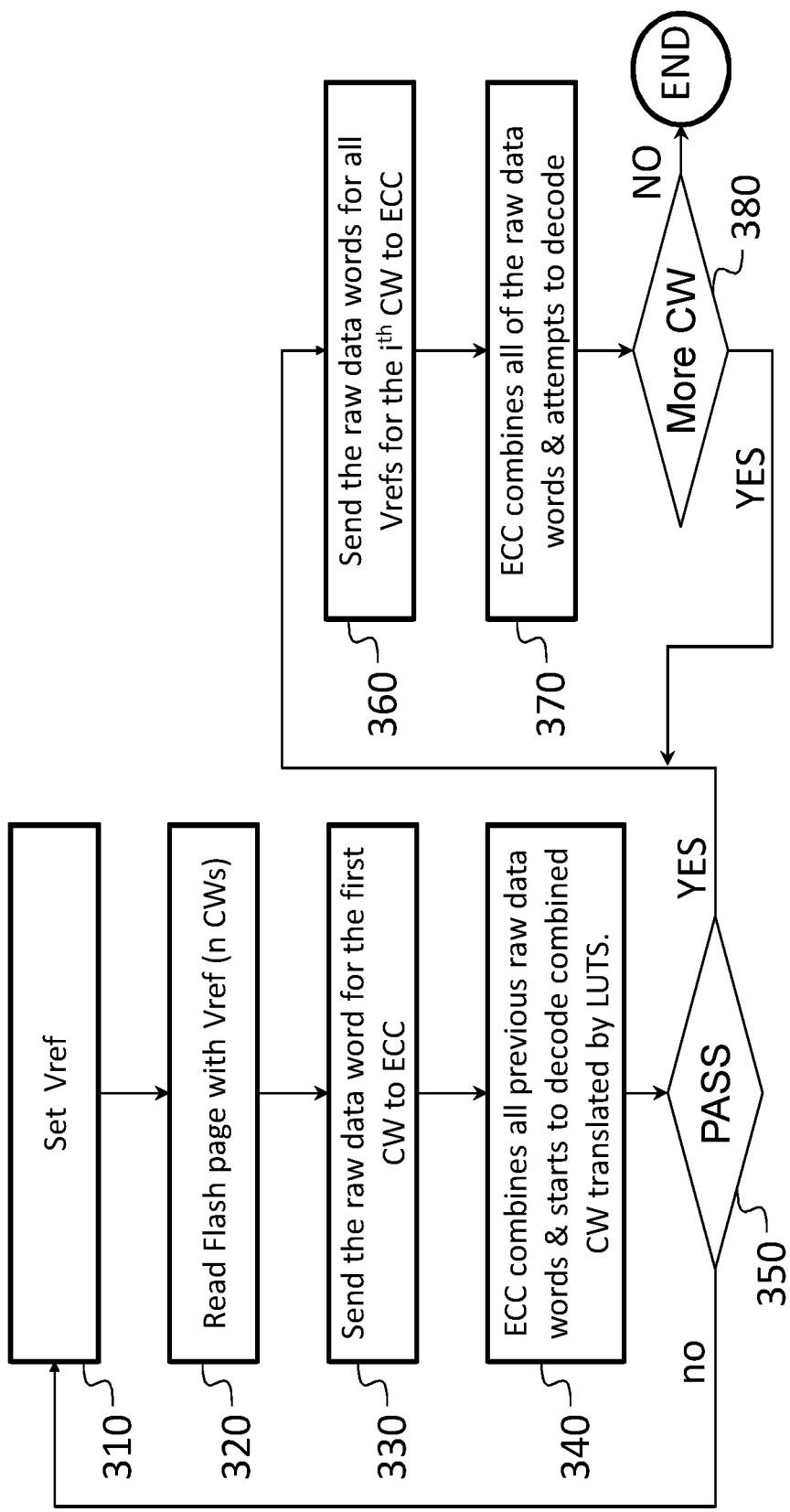
FIG. 3 is a flow chart of a method for performing adaptive multiple reads, according to an embodiment of the present invention.

Code words stored together in one flash page (i.e., in the same page of flash memory) may have similar histories and the smallest number of read operations resulting in a successful decoding attempt may be the same for all of them. Accordingly, as illustrated in FIG. 3, a plurality of code words (e.g., n code words) within a page may be read one or more times, with the number of read operations being adapted to allow successful decoding of a first code word (e.g., cw0) from among the plurality of code words. The remainder of the code words in the page may then also be decoded, using the raw data words already read. In act 310, a reference voltage is set, in act 320, a read operation is performed at the reference voltage, in act 330, the raw data word from the read attempt is sent to the ECC subsystem, and in act 340, a decoding attempt is made. As described above, this process is repeated until a decoding attempt of the first code word succeeds. In act 360 the raw data words from the same read operations for the $i^{th}$ code word (i.e., the second code word, the third code word, etc.) are sent to the ECC subsystem 240, and used, in an act 370, in a decoding attempt. Acts 360 and 370 may then be repeated until there are (as determined in act 380) no more code words to be decoded, from within the same page as the first code word.

Figure 4:
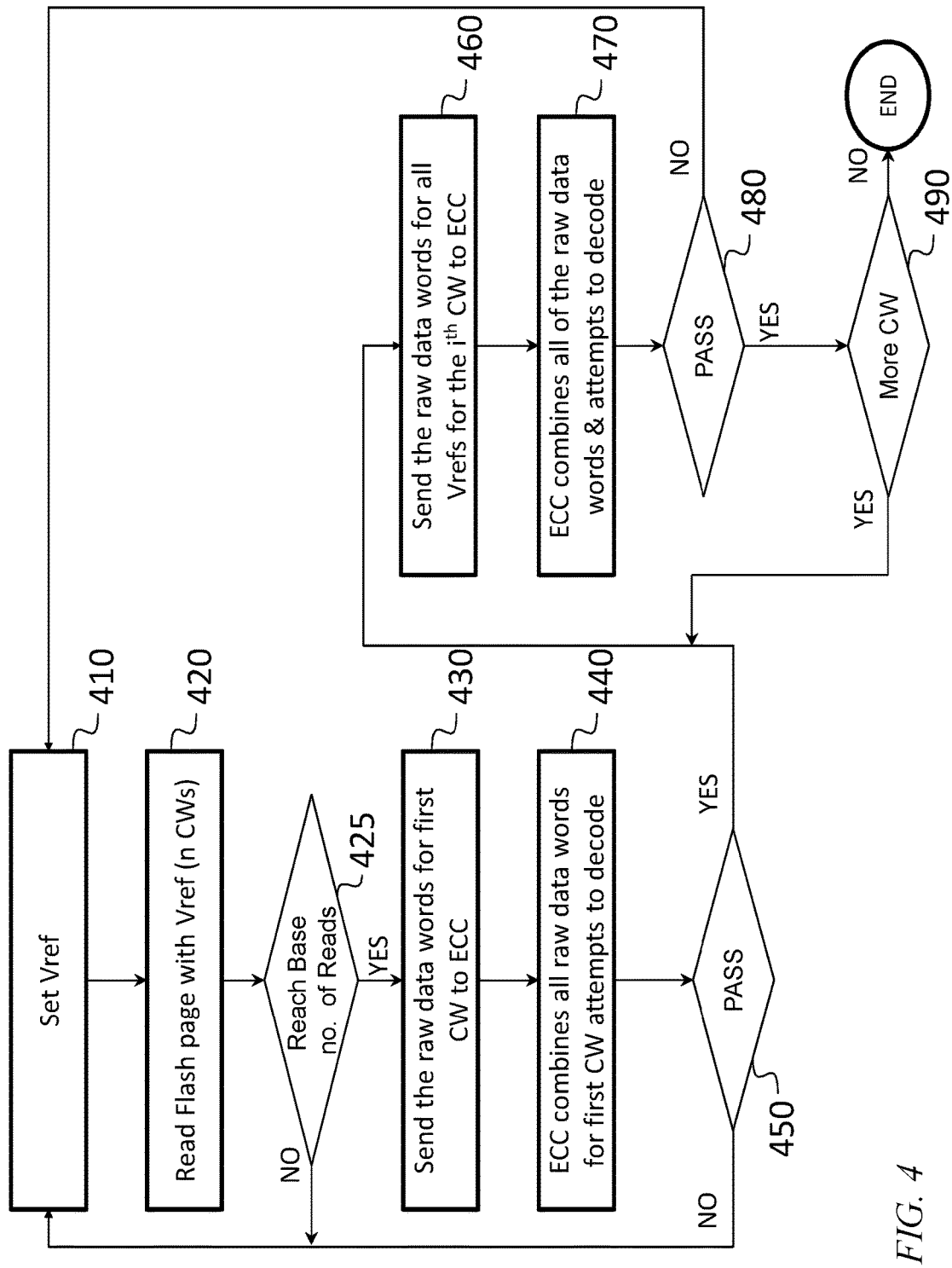
FIG. 4 is a flow chart of a method for performing adaptive multiple reads, according to an embodiment of the present invention.

Referring to FIG. 4, in another embodiment, the method of FIG. 3 is modified in two respects. First, as illustrated in acts 410, 420, and 425, the process may perform a minimum, or "base" number of reads before performing the first decoding attempt on the first code word (cw0). Second, during the decoding of the remaining code words (after the first code word has been successfully decoded), if one of the decoding attempts fails (as determined in act 480) the system may perform additional read operations. In this embodiment, the base number of reads is programmable by the firmware.

Figure 5A:
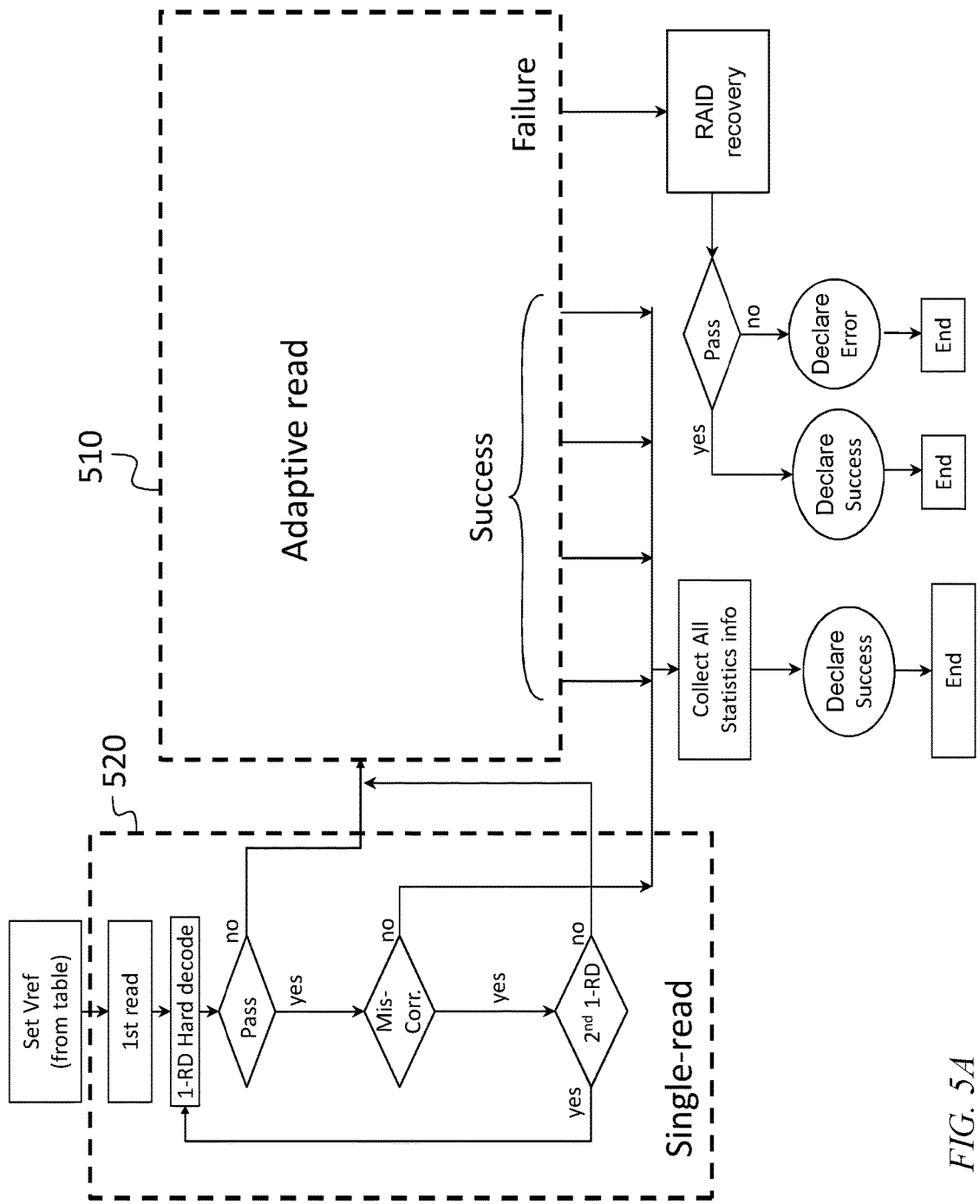
FIG. 5A is a flow chart of a method for performing adaptive multiple reads, according to an embodiment of the present invention.
Figure 5B:
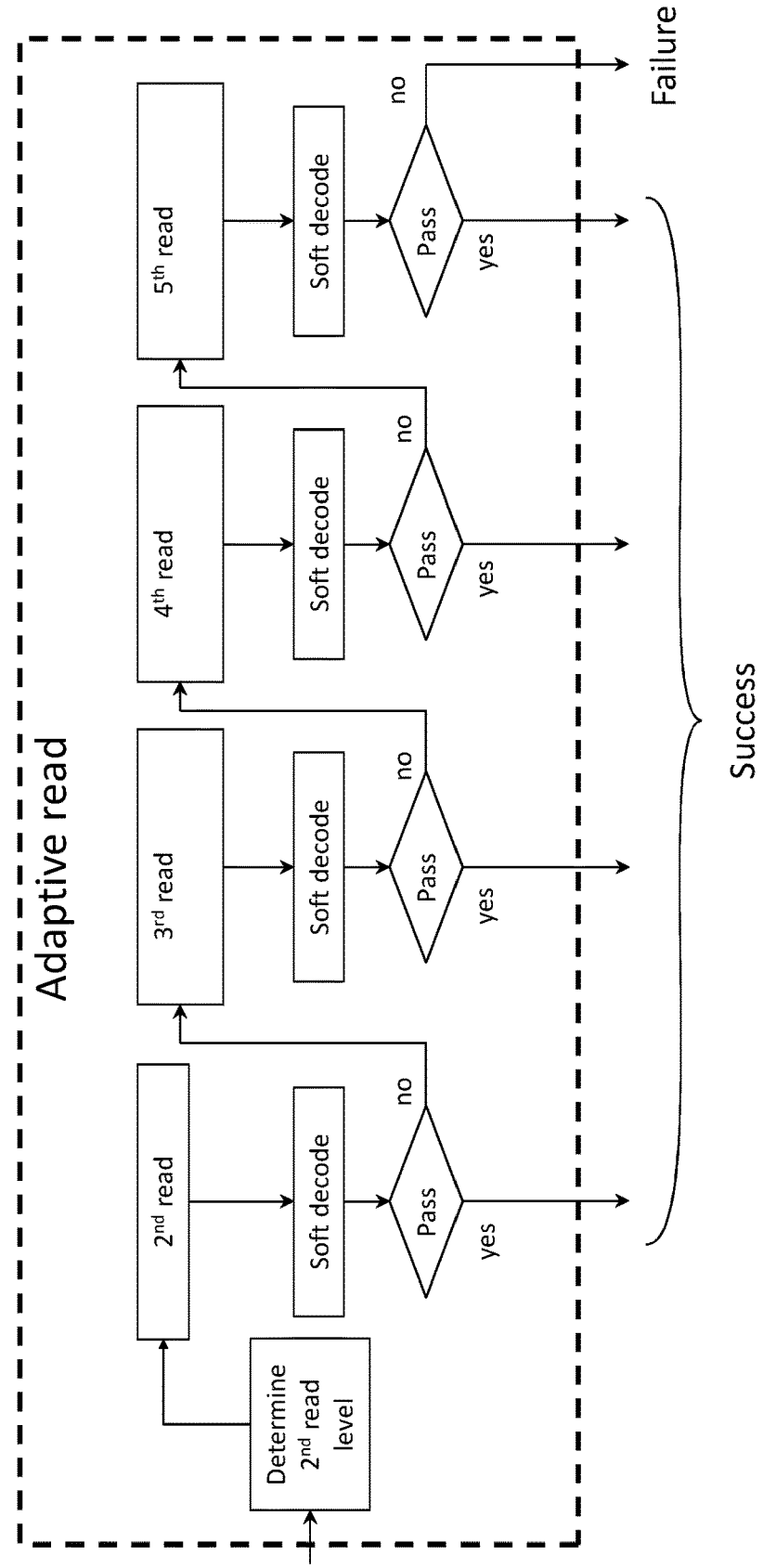
FIG. 5B is a flow chart of a method for performing adaptive multiple reads, according to an embodiment of the present invention.

FIGS. 5A and 5B show a method of adaptive multiple read operation, according to one embodiment. The method includes a single read ECC decoding portion 520 and an adaptive multiple read decoding portion 510, details of which are shown in FIG. 5B. In FIG. 5A, if a mis-correction ("Mis-Corr.") is detected (e.g., as a result of a cyclic redundancy check (CRC) failure), the system may execute one or more additional one-read read operations and decoding attempts, with the reference voltage set to one or more respective different values. After successful decoding attempts statistical information may be collected (e.g., by comparing the raw data words and the decoded code words) to assist, for example, in selecting reference voltage levels for future read operations. For example, if it is determined that the number of bit flips at the first read operation has an imbalance (e.g., there being more 0-to-1 bit flips than 1-to-0 bit flips) then the reference voltage used for the first read operation may be increased or decreased (e.g., by one increment of the reference voltage step size) so as to reduce the imbalance. FIGS. 5A and 5B illustrate an embodiment with up to 4 additional read operations in the adaptive multiple read decoding portion 510 of FIG. 5B; in other embodiments there may be more or fewer additional read operations available in the adaptive multiple read decoding portion 510.

Similarly, other reference voltages used for second, or third (or later) read operations may be adjusted so that (i) they are sufficiently different from other reference voltages to result in different raw data words than those already read and (ii) they are not sufficiently extreme to result in raw data words that differ excessively from those obtained for adjacent reference voltages. These criteria may be used to automatically adjust the reference voltages or to find, empirically, a set of reference voltages that provides acceptable performance. Reference voltages may be uniformly spaced (e.g., each being separated from the others by a set multiple of the reference voltage step size) or they may be non-uniformly spaced (in the latter case a table may be used to specify the reference voltages, in units of the reference voltage step size). The table used to set the initial reference voltage (and that may be used to set subsequent reference voltages) may be generated from data on the characteristics of the flash memory cells; such data may be provided by the manufacturer of the flash memory devices and/or generated from the collected statistics. The table may have multiple entries for each reference voltage, the different entries corresponding to different cell ages (measured, e.g., by the number of program/erase cycles). In operation, it may be the case that multiple read operations are rarely used to execute a read command, and the control logic may be a single-thread design, i.e., decoding operations are processed one at a time. Although some embodiments are described herein as using an LDPC error correcting code, the invention is not limited thereto, and the error correcting code may be any error correcting code which can take soft information.

In light of the foregoing, a solid state drive may employ adaptive multiple-read to perform enhanced performance error correction using soft decisions without a performance penalty that otherwise might result from performing unnecessary read operations. The soft decision error correcting algorithm may employ lookup tables containing log likelihood ratios. The method may include performing one or more read operations to obtain one or more raw data words for a code word, attempting to decode the code words using the one or more raw data words, and performing additional read operations when the decoding attempt fails. This process may be repeated until a decoding attempt succeeds.

Various processing operations described above may be performed by the controller of the solid state drive 110. The controller may be a processing circuit. The term "processing circuit" is used herein to include any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed circuitboard (PCB) or distributed over several interconnected PCBs. A processing circuit may contain other processing circuits; for example a processing circuit may include two processing circuits, an FPGA and a CPU, interconnected on a PCB.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a system and method for adaptive multiple read of NAND flash have been specifically described and illustrated herein, many modifications and variations will be apparent to those skilled in the art. Accordingly, it is to be understood that a system and method for adaptive multiple read of NAND flash constructed according to principles of this invention may be embodied other than as specifically described herein. The invention is also defined in the following claims, and equivalents thereof.

What is claimed is:

1. A method for reading data, the method comprising:
performing a first read operation on a first plurality of flash memory cells, at a first reference voltage, to form a first raw data word;
executing a first error correction code decoding attempt with the first raw data word;
when the first error correction code decoding attempt succeeds:
outputting a decoded data word generated by the first error correction code decoding attempt; and
when the first error correction code decoding attempt does not succeed:
performing a second read operation on the first plurality of flash memory cells, at a second reference voltage, to form a second raw data word; and
executing a second error correction code decoding attempt with both the first raw data word and the second raw data word.

2. The method of claim 1, wherein the performing of the first read operation comprises storing the first raw data word in a buffer, the buffer having sufficient capacity to store the first raw data word and the second raw data word.

3. The method of claim 1, wherein the performing of the second error correction code decoding attempt comprises fetching, from a first lookup table, a log likelihood ratio corresponding to:
a bit of the first raw data word; and
a corresponding bit of the second raw data word.

4. The method of claim 1, further comprising,
when the second error correction code decoding attempt succeeds:
outputting a decoded data word generated by the second error correction code decoding attempt; and
when the second error correction code decoding attempt does not succeed:
performing a third read operation on the first plurality of flash memory cells, at a third reference voltage, to form a third raw data word; and
executing a third error correction code decoding attempt with the first raw data word, the second raw data word, and the third raw data word.

5. The method of claim 4, wherein the performing of the third error correction code decoding attempt comprises fetching, from a second lookup table, a log likelihood ratio corresponding to:
a bit of the first raw data word;
a corresponding bit of the second raw data word; and
a corresponding bit of the third raw data word.

6. The method of claim 1, further comprising:
performing a third read operation on a second plurality of flash memory cells, at the first reference voltage, to form a third raw data word, the second plurality of flash memory cells being in one page of flash memory with the first plurality of flash memory cells; and
when the first error correction code decoding attempt does not succeed:
performing a fourth read operation on the second plurality of flash memory cells, at the second reference voltage, to form a fourth raw data word.

7. The method of claim 6, further comprising:
when the second error correction code decoding attempt succeeds:
performing a third error correction code decoding attempt with the third raw data word and the fourth raw data word.

8. The method of claim 7, further comprising:
when the third error correction code decoding attempt succeeds:
outputting a decoded data word generated by the third error correction code decoding attempt; and
when the third error correction code decoding attempt does not succeed:
performing a fifth read operation on the second plurality of flash memory cells, at a third reference voltage, to form a fifth raw data word; and
executing a fourth error correction code decoding attempt with the third raw data word, the fourth raw data word, and the fifth raw data word.

9. A solid state drive, comprising:
flash memory; and
a processing circuit,
the processing circuit being configured to:
perform a first read operation on a first plurality of flash memory cells, at a first reference voltage, to form a first raw data word;
execute a first error correction code decoding attempt with the first raw data word;
when the first error correction code decoding attempt succeeds:
output a decoded data word generated by the first error correction code decoding attempt; and
when the first error correction code decoding attempt does not succeed:
perform a second read operation on the first plurality of flash memory cells, at a second reference voltage, to form a second raw data word; and
execute a second error correction code decoding attempt with both the first raw data word and the second raw data word.

10. The solid state drive of claim 9, wherein the performing of the first read operation comprises storing the first raw data word in a buffer, the buffer having sufficient capacity to store the first raw data word and the second raw data word.

11. The solid state drive of claim 9, wherein the performing of the second error correction code decoding attempt comprises fetching, from a first lookup table, a log likelihood ratio corresponding to:
a bit of the first raw data word; and
a corresponding bit of the second raw data word.

12. The solid state drive of claim 9, wherein the processing circuit is further configured to:
when the second error correction code decoding attempt succeeds:
output a decoded data word generated by the second error correction code decoding attempt; and
when the second error correction code decoding attempt does not succeed:
perform a third read operation on the first plurality of flash memory cells, at a third reference voltage, to form a third raw data word; and
execute a third error correction code decoding attempt with the first raw data word, the second raw data word, and the third raw data word.

13. The solid state drive of claim 12, wherein the performing of the third error correction code decoding attempt comprises fetching, from a second lookup table, a log likelihood ratio corresponding to:
a bit of the first raw data word;
a corresponding bit of the second raw data word; and
a corresponding bit of the third raw data word.

14. The solid state drive of claim 9, wherein the processing circuit is further configured to:
  perform a third read operation on a second plurality of flash memory cells, at the first reference voltage, to form a third raw data word, the second plurality of flash memory cells being in one page of flash memory with the first plurality of flash memory cells; and
  when the first error correction code decoding attempt does not succeed:
    perform a fourth read operation on the second plurality of flash memory cells, at the second reference voltage, to form a fourth raw data word.

15. The solid state drive of claim 14, wherein the processing circuit is further configured to:
  when the second error correction code decoding attempt succeeds:
    perform a third error correction code decoding attempt with the third raw data word and the fourth raw data word.

16. The solid state drive of claim 15, wherein the processing circuit is further configured to:
  when the third error correction code decoding attempt succeeds:
    output a decoded data word generated by the third error correction code decoding attempt; and
  when the third error correction code decoding attempt does not succeed:
    perform a fifth read operation on the second plurality of flash memory cells, at a third reference voltage, to form a fifth raw data word; and
    execute a fourth error correction code decoding attempt with the third raw data word, the fourth raw data word, and the fifth raw data word.

17. The method of claim 1, further comprising, after at least two decoding attempts, the last of which succeeded, adjusting the first reference voltage, based on one or more statistics of differences, the differences including the difference between a raw data word and a decoded data word generated by the successful error correction code decoding attempt.

18. The solid state drive of claim 9, wherein the processing circuit is configured, after at least two decoding attempts, the last of which succeeded, to adjust the first reference voltage, based on one or more statistics of differences, the differences including the difference between a raw data word and a decoded data word generated by the successful error correction code decoding attempt.

\* \* \* \* \*